United States Patent
Brambilla et al.

[11] Patent Number: 5,874,852
[45] Date of Patent: Feb. 23, 1999

[54] CURRENT GENERATOR CIRCUIT HAVING A WIDE FREQUENCY RESPONSE

[75] Inventors: Davide Brambilla; Daniela Nebuloni; Giorgio Rossi, all of Milano; Sergio Lecce, Pavia, all of Italy

[73] Assignee: SGS-Thomson Microelectronics, S.r.l., Milano, Italy

[21] Appl. No.: 706,068

[22] Filed: Aug. 30, 1996

[30] Foreign Application Priority Data

Aug. 31, 1995 [EP] European Pat. Off. .............. 95830369

[51] Int. Cl.$^6$ ........................................... H03F 3/343
[52] U.S. Cl. ..................... 327/538; 327/543; 330/288; 323/315
[58] Field of Search ................................. 327/538–543; 323/312, 315, 316, 317; 330/288

[56] References Cited

U.S. PATENT DOCUMENTS

| 4,019,071 | 4/1977 | Ahmed | 330/22 |
|---|---|---|---|
| 4,686,487 | 8/1987 | Radovsky | 330/288 |
| 4,879,524 | 11/1989 | Bell | 330/288 |
| 5,349,307 | 9/1994 | Inagaki | 330/288 |
| 5,612,614 | 3/1997 | Barrett, Jr. et al. | 323/316 |

FOREIGN PATENT DOCUMENTS

| 58-79312 | 5/1983 | Japan | 330/288 |
|---|---|---|---|
| 62-23213 | 1/1987 | Japan | 330/288 |
| 62-5708 | 1/1987 | Japan | 330/288 |

OTHER PUBLICATIONS

"Microelectronic Circuits", Sedra et al., published by Saunders College Publishing, pp. 440–443, 1991.

Primary Examiner—Tuan T. Lam
Attorney, Agent, or Firm—Michele A. Mobley; Jenkins & Gilchrist

[57] ABSTRACT

A current generator circuit with controllable frequency response has at least one current mirror formed of MOS transistors, being powered through a terminal held at a constant voltage, having an input leg through which a reference current (I1) is driven by a first current generator (G1), and having an output leg for generating, on an output terminal (OUT) of the mirror, a mirrored current ($I_{out}$) which is proportional to the reference current (I1). The input leg includes at least a first transistor (M1) which is diode-connected and has a control terminal (Ga1) coupled to a corresponding terminal (Ga2) of a second transistor (M2) included in the output leg by an impedance matching circuit configured to hold the same voltage value at both terminals (Ga1 and Ga2). The impedance matching circuit has an adjustable output impedance, specifically lower in value than the value to be had without this circuit. It functions to regulate the impedance on the control node (Ga2) of the second transistor (M2). The invention is equally applicable to N-channel and P-channel MOS transistors. Advantageously, the reference current can be varied by an external signal which is a function of the output signal, to provide feedback regulating features.

3 Claims, 6 Drawing Sheets

CURRENT GENERATOR CIRCUIT HAVING A WIDE FREQUENCY RESPONSE

CROSS-REFERENCE TO RELATED APPLICATION

This application claims priority from European 95830369.5, filed Aug. 31, 1995, which is hereby incorporated by reference. However, the content of the present application is not necessarily identical to that of the priority application.

BACKGROUND AND SUMMARY OF THE INVENTION

This invention relates to a current generator circuit having a wide frequency response.

In particular, this circuit is of the type which comprises at least one current mirror formed of MOS transistors, being powered through a terminal held at a constant voltage, having an input leg which includes at least a first diode-connected transistor through which a reference current is forced by a first current generator coupled to a first terminal of the first transistor, and having an output leg which includes at least a second transistor to generate, onto an output terminal of the mirror coupled to a first terminal of the second transistor, a mirrored current which is proportional to the reference current. A control terminal of the first transistor is coupled to a corresponding control terminal of the second transistor. The first and second transistors also have respective second terminals connected to the terminal held at the constant voltage.

Reference will be specifically made herein, for illustration purposes only, to a voltage regulator having an output stage formed by a circuit as described above and useful, for example, in a driving system for automotive audio devices.

As is well known, the connection of two transistors into a so-called "current mirror" configuration is frequently employed in the design of electric circuits, in particular as integrated monolithically. This configuration allows a current to be transferred to an output leg from an input leg while retaining the same flow direction for the current. The current which is flowing through the input leg may be, for example, that supplied by a reference current generator. The output current will be proportional to the input current by a predetermined factor, which may be equal to unity but more commonly has a much greater value than unity and is determined by the ratio of the device dimensions. The ratio of the output leg current to the input leg current is, therefore, equal to that constant factor, and is called the mirror ratio.

This configuration, whereby a current with a predetermined value can be obtained, is a basic one in so-called current generator circuits. The latter may include a mirror circuit of varying complexity, or alternatively, a number of mirror circuits cascade-connected with one another.

One exemplary application of a circuit arrangement of this kind is to driver circuits for an electric load using a power type of driving transistor connected directly to the load. In this case, the power transistor represents the output end of a more complicated circuit, such as a voltage regulator. In order to make the output current stable, the transistor is connected into a mirror configuration with an additional transistor provided upstream.

Conventional types of current mirror circuits are analytically reviewed, for example, in a book by P. R. Gray and R. G. Meyer entitled "Analysis and Design of Analog Integrated Circuits", Wiley, New York, 1984, at pages 233–246 and 703–718, which is hereby incorporated by reference. Other basic and general background may be found in the following books, all of which are hereby incorporated by reference: the ANALOG CIRCUIT DESIGN SEMINAR books published by Analog Devices; ANALOG CIRCUIT DESIGN (ed. J. Williams 1991); Analog Dialogue from 1980 to date; Collins, ANALOG ELECTRONICS HANDBOOK (1989); Coughlin and Driscoll, OP AMPS AND LINEAR INTEGRATED CIRCUITS 3.ed.(1991); Davidse, INTEGRATION OF ANALOGUE ELECTRONIC CIRCUITS; Feucht, HANDBOOK OF ANALOG CIRCUIT DESIGN (1990); Geiger et al., VLSI DESIGN TECHNIQUES FOR ANALOG AND DIGITAL CIRCUITS; Gray & Meyer, ANALYSIS & DESIGN OF ANALOG INTEGRATED CIRCUITS (2.ed. 1983 and 3.ed. 1993); Grebene, BIPOLAR & MOS ANALOG IC DESIGN (1984); Haskard and May, ANALOG VLSI DESIGN (1987); L. P. Huelsman, and P. E. Allen, INTRODUCTION TO THE THEORY AND DESIGN OF ACTIVE FILTERS (1980); Moschytz, LINEAR INTEGRATED NETWORKS: DESIGN (1975); Moschytz, LINEAR INTEGRATED NETWORKS: FUNDAMENTALS (1974); Pease, TROUBLESHOOTING ANALOG CIRCUITS; Schaumann et al., DESIGN OF ANALOG FILTERS (1990); J. Scott, ANALOG ELECTRONIC DESIGN (1991); Soclof, "Design and Applications of Analog Integrated Circuits"; Toumazou et al., ANALOGUE IC DESIGN: THE CURRENT-MODE APPROACH; Van Valkenburg, ANALOG FILTER DESIGN (1982); Thomas Young, LINEAR INTEGRATED CIRCUITS (1981).

In general, such circuits can be implemented using either bipolar transistors or transistors of the MOS type.

As explained in detail in the above reference, a current mirror comprises, in its most basic form, only two transistors and a current generator which supplies the current to be transferred to the output, that is the reference current, as previously mentioned. The generator can be implemented, for instance, by a resistor connected to a terminal of a voltage supply and to one of the transistors which forms the input transistor.

This circuit arrangement is quite simple, and is used in circuits which have no strict requirements in terms of accuracy. Other, more elaborate and just as well known configurations, such as that commonly referred to as Wilson's—involving the provision of additional transistors—are used in more sophisticated designs.

Furthermore, mirror circuits of the bipolar type usually require a small triggering voltage and pose no problems of response speed, but need comparatively large currents for their turn-on. By contrast, mirror circuits of the MOS type, when including a power type of output transistor, do have response problems at high frequencies.

For a specific application, the choice between bipolar and MOS transistors is determined by different factors, both in terms of manufacturing process and of electric characteristics.

Within the scope of the present invention, reference will be made in particular to current mirror arrangements of the MOS type. Both P-channel MOS transistors, abbreviated to P-MOS, and N-channel MOS transistors, briefly N-MOS, will be considered on equal terms.

Shown in FIG. 1 is a typical arrangement for the simplest of conventional current mirror generator circuits of the MOS type, basically comprised of a transistor pair and a current generator. By way of example, the transistors shown in that Figure are in particular of the P-channel MOS type. The mirror circuit is generally denoted in the Figure by the reference numeral 1.

The current mirror 1 comprises a diode-connected input transistor M1, that is a transistor which has a gate terminal Ga1 shorted to a drain terminal D1. The drain terminal D1 of M1 is further connected to a supply terminal, specifically a ground terminal, which forces a current I1 to flow through M1. This current, which represents the input current to the mirror 1, is constant and has a predetermined value. The transistor M1 forms, in combination with the generating stage G1, the input leg of the mirror 1.

A second output transistor M2 has a gate terminal Ga2 connected to the gate terminal Ga1 of the first transistor, M1. A drain terminal D2 of M2 is connected to an output terminal OUT of the circuit 1. The transistor M2 forms the output leg of the mirror, through which the current generated by the circuit and supplied to its output is caused to flow. This current is schematically indicated in the Figure by an arrow Iout.

The transistors M1 and M2, being in a mirror configuration, are coupled together through their respective gate terminals, Ga1 and Ga2.

Furthermore, both transistors, M1 and M2, are powered through their respective source terminals, S1 and S2, which are held at the same constant voltage. In particular, and as shown in FIG. 1, the source terminals S1 and S2 are connected to a supply line, schematically denoted by Vbat, which may represent the connection to one pole of a source of constant voltage, such as the battery of a motor vehicle.

In steady-state operation of the circuit shown in FIG. 1, since the transistor M1 has its gate and drain shorted together, the gate-source voltage Vgs exceeds the threshold value of the transistor, which is tied to the transistor's own construction. Thus, the transistor will be operating in saturation and the current I1 supplied by the generator G1 will be flowing through it. Since the transistors M1 and M2 have their gate terminals Ga1 and Ga2 connected to each other and both their respective source terminals S1 and S2 connected to Vbat, the transistor M2 will have the same gate-source voltage as the transistor M1. A mirrored current, that is the output current Iout whose value is proportional to that of the input current I1 according to mirror ratio, as previously mentioned, will be flowing through it.

Specifically, in a case where the circuit has been integrated, the mirror ratio between the output current and the input current would be equal to the ratio between the quantities (W/L)2 and (W/L)1 for the transistors M2 and M1, respectively, where W is the channel width and L the channel length. In general, the size of M2 relative to M1 increases proportionally with the value of the mirror ratio.

Also shown, in FIG. 2, for completeness' sake, is a current mirror circuit, again generally denoted by 1, which is similar to that shown in FIG. 1 but in which the MOS transistors are of the N-channel type, so that the signs of the voltages are reversed. The source terminals S1 and S2 of the transistors M1 and M2 are here connected to a ground terminal, and the current generator G1 is connected between the supply terminal and the drain terminal D1 of the transistor M1.

The circuit depicted in FIG. 2 operates in an equivalent manner to that shown in FIG. 1, however, the respective currents flow in opposite directions.

The current mirror circuit 1 just described shows, however, certain drawbacks in the respect of its frequency response.

Prior to undertaking a detailed analysis of the circuit, note that MOS transistors have at their gate terminals an effective intrinsic capacitance which is non-zero and can cause delays in the transistor operation. More specifically, in the construction of a MOS transistor, whether of the N-channel or P-channel type, two capacitances are to be found, as seen from the gate terminal, namely a gate-to-source capacitance Cgs and a gate-to-drain capacitance Cgd. The values of these capacitances are proportional to the source and drain areas of the transistor.

Referring to current mirror circuits wherein the value of the mirror ratio is fairly large, for the applications encompassed by the present invention, the capacitances of the smaller transistor, i.e. the input transistor, are negligible compared to the corresponding intrinsic capacitances of the output transistor, which transistor may commonly be a power transistor, as mentioned above. In this respect, it is assumed that the area, say equal to unity, of the transistor M1 is much smaller than the area of the transistor M2, assumed to be equal to the mirror ratio X. Only the gate-to-source and gate-to-drain capacitances of the last-mentioned transistor have been indicated in dash lines and briefly denoted by Cs and Cd, respectively, in FIGS. 1 and 2.

The presence of the dominate capacitance Cs, which increases in value with an increase in the mirror ratio (and corresponding increase in the size of M2), contributes greatly to the aforementioned problems. As can be easily construed from an analysis of the frequency stability of the circuit according to FIGS. 1 and 2, its transfer function, i.e. the mathematical law that governs the output-to-input signal relation, has at a certain frequency a pole which is determined by the presence of the intrinsic capacitances on the gate of M2. As is known, the pole has the effect of depressing the circuit gain from that frequency at a constant rate of attenuation.

The so-called cutoff frequency f1 introduced by the pole into the mirror circuit of FIGS. 1 and 2 specifically is $f1=(\frac{1}{2}\pi) \times gm_{M1}/(Cs+Cd)$, where $gm_{M1}$ is the transconductance of the transistor M1. The term Cs+Cd is easily explained as being the effective overall capacitance—seen from the gate terminal of M2 whence the two capacitances would appear to be in parallel, so to speak. Since Cs is much greater than Cd, the sum of Cs+Cd is essentially equal to Cs; and with Cs being a fairly large value, the cutoff frequency f1 will be relatively low, on the order of hundreds of kHz.

More poles would also be present, of necessity, in the overall transfer function which characterizes the circuit and its specific application. For example, an electric load is connected to the output OUT of the mirror circuit 1, as previously mentioned, which load can be outlined by the series connection of a resistive load with a capacitive load. Thus, the presence of a capacitive load on the terminal OUT creates a further pole in the transfer function.

The simultaneous presence of two poles can produce instability in the circuit operation, in cases where the circuit is inserted in a feedback loop, as is well known to those skilled in the art. A critical situation occurs when the respective cutoff frequencies lie sufficiently close together to cause the combined effects of both poles, which are manifested by a doubled gain falling rate, to become substantial before the gain has dropped down to a unity value.

With reference to the current mirror of FIGS. 1 and 2, the load applied to the output OUT usually has a large capacitive value. Accordingly, it introduces a pole at a fairly low frequency f2, again on the order of hundreds of kHz. In addition, the value of f2 shifts according to the applied load. On the other hand, the pole relating to the gate capacitances of the transistor M2 is, as already mentioned, at an equally low frequency, higher than but close to that due to the load. The frequency of the pole introduced by M2, moreover, approximates that due to the load as the area of M2 and the mirror ratio increase.

Thus, the operation of the conventional current mirror circuit as illustrated by FIGS. 1 and 2 shows some instability due to the presence of a large capacitance on the control node of the output transistor M2. This capacitance is also responsible for delays in the steady state operation of the circuit.

The technical problem underlying this invention is to provide a current generator circuit of the current mirror type, whereby the adverse effect of the intrinsic capacitance on the gate node of the output transistor can be made negligible. The circuit forming the subject of this invention should have an extended range of frequency response.

Another object of the invention is to provide a current mirror circuit of simple construction which can be manufactured by a process of least complexity, and which, when integrated monolithically, would occupy a reduced integration area, while assuring satisfactory performance.

Innovative Current Mirror

The solvent idea on which this invention is predicated is one of providing a current generator circuit of the current mirror type, whereby the effective overall capacitance present on the control node of the output transistor of the current mirror can be controlled, and in particular, made lower in value than the intrinsic capacitance anyhow present on that same node. To this aim, an element is provided which drives the node with a selected impedance.

A current generator circuit having a controllable frequency response comprises at least one current mirror of the MOS transistor type. The current mirror has an input leg which includes at least a first diode-connected transistor, and an output leg which includes at least a second transistor. A reference current is forced through the first transistor by means of a first current generator which is coupled to a first terminal of the transistor, specifically a drain terminal thereof. The two transistors have respective control terminals, i.e. gate terminals, which are coupled together. The mirror generates, on an output terminal thereof which is coupled to a first or drain terminal of the second transistor, a mirrored current which is proportional to the aforementioned reference current.

Furthermore, the current mirror is powered through a terminal which is held at a constant voltage; in particular, the first and second transistors have respective second terminals, namely their source terminals, which are held at this constant voltage.

In accordance with the invention, an impedance matching means is connected between the control terminals of the first and second transistors. This means is arranged to hold both control terminals at the same voltage level, so that the current mirror can properly operate.

Also in accordance with the invention, the impedance matching means preferably comprises a voltage follower having a first input, namely an input of the non-inverting type, connected to the gate terminal of the first transistor, and an output connected to the gate terminal of the second transistor and feedback-connected to a second input, specifically an input of the inverting type, of the follower.

In essence, the impedance matching means has an output impedance which can be adjusted, and in particular—for the primary purpose of this invention—has a lower value than would be the case without this means. It functions to regulate the impedance on the control node of the output transistor, i.e. the second transistor.

Particularly in a preferred embodiment of the invention, the voltage follower comprises a third transistor which functions as a low output impedance amplifying element connected with its output to the gate of the second transistor, and a fourth transistor which is connected to the first transistor of the mirror and configured to act as a mirror with the third, whereby the gate terminals of the first and second transistors will be held at the same potential.

This invention can be applied equally well to MOS transistors of the N-channel and P-channel types.

Based on the solvent idea, the technical problem is solved by a current generator circuit having a controllable frequency response, as described herein and defined in the appended Claims.

The problem is also solved by a method of generating at a controlled rate a mirrored current from a reference current, as described herein and defined in the appended Claims.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 2:
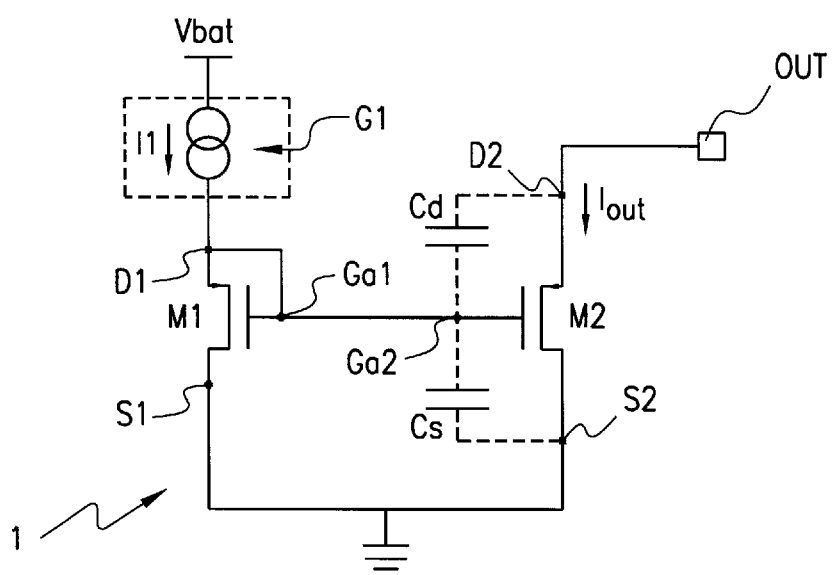
Figure 3:
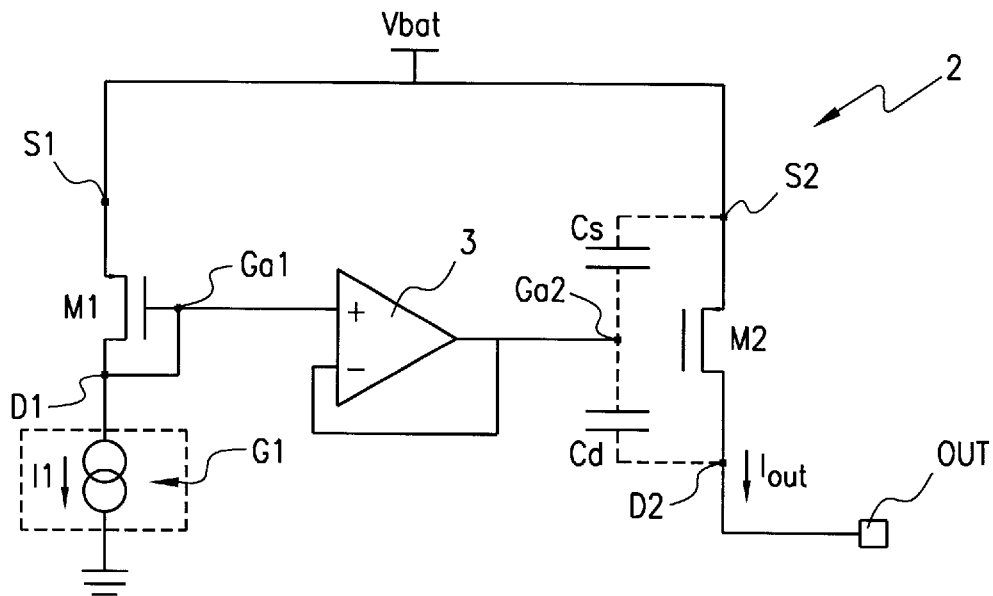
FIG. 3 is a diagram of a current generator circuit of the current mirror type according to this invention.

The numerous innovative teachings of the present application will be described with particular reference to the presently preferred embodiment (by way of example, and not of limitation), in which:

Shown in FIG. 3 is a general diagram of a current generator circuit of the type which comprises a current mirror with MOS transistors, according to this invention. The same reference numerals and symbols as in FIGS. 1 and 2 have been used to denote similar elements in FIG. 3.

The current mirror circuit of this invention is generally denoted by the reference 2. Preferably, this would be integrated monolithically. By way of example only, the current mirror includes P-channel MOS transistors.

The mirror circuit 2 has an input leg through which a reference current I1 is caused to flow which is supplied from a first current generator, contained in a block G1, and an output leg for generating, on an output terminal OUT of the mirror, a mirrored current Iout which is proportional to the reference current I1. The proportionality constant is determined by the mirror ratio X, like in conventional current mirror circuits.

The input leg includes a first transistor M1, which is diode-configured, i.e. has a drain terminal D1 and a gate terminal Ga1 shorted together. The aforementioned reference current I1, having a predetermined constant value, is forced through M1. For that purpose, the current generator G1 is connected to a first terminal, specifically the drain terminal D1, of the transistor M1 and to a ground terminal. The current I1, forming the input current of the mirror 2, may optionally be selected according to an external signal of the circuit, as explained hereinafter in details.

The output leg includes a second transistor M2 through which the current $I_{out}$ is flowed and which has a first terminal, i.e. its drain terminal D2 according to FIG. 3, connected to the output terminal OUT of the mirror circuit 2.

As already mentioned in connection with prior art mirror circuits, the relative sizes of the two transistors M2 and M1 sets the ratio $I_{out}/I1$ of the output current to the reference current, that is the mirror ratio X. In the applications for which this invention is primarily intended, the number X would preferably be a fairly large one, and therefore, the second transistor M2 be a definitely greater size than the first transistor M1.

Also, the current mirror 2 is powered through a terminal Vbat which is held at a constant voltage. In particular, Vbat is exemplified by a battery voltage in the instance of an automotive application; however, it could represent in a specified application any supply line effective to provide a constant voltage. Specifically, second terminals, namely the source terminals S1 and S2, of the transistors M1 and M2 are held at the aforementioned constant voltage Vbat.

In accordance with this invention, the respective control terminals, i.e. the gate terminals Ga1 and Ga2, of the two transistors M1 and M2 are not connected directly to each other, but are coupled through an impedance matching means, shown at 3 in FIG. 3. This means 3 is designed to hold the same voltage on the respective gate terminals of M1 and M2.

A simple embodiment of this scheme is diagrammatically depicted in FIG. 3, where the means 3 is shown to comprise a voltage follower. As shown in the Figure, the voltage follower 3 has a first input connected to the gate terminal Ga1 of the first transistor M1, and an output connected to the gate terminal Ga2 of the second transistor M2 and feedback-connected to a second input of the follower. In this scheme, the first input is of the non-inverting type and conventionally denoted by a "+" sign, whereas the second feedback input is an inverting type and denoted by a "−" sign.

In the current generator circuit 2 of this invention, the transistors M1 and M2 are arranged to operate in a current mirror configuration similar to the corresponding transistors in the prior art circuit 1. In this respect, it should be noted that a condition of operation is that the above-mentioned transistors should have the same gate-source voltage in order for them to operate in a proper "mirror" mode. Thus, in a steady state condition, the input transistor M1, being operated at a sufficient gate-source voltage to ensure its turning on, will admit the current from the generator G1, so that through M2 the exact mirrored current can be flowed.

To this aim, both transistors should have the same gate voltage at any time. This function is provided, in the circuit of this invention, by coupling the two gate terminals through the structure of the voltage follower type. In fact, such a circuit element allows the same voltage to be held at the output as is present at an input thereof. The scheme shown essentially allows the voltage to be compared, and then, held the same at its inputs, or at its first "+" input and its output, and hence at the control terminals Ga1 and Ga2 of M1 and M2.

The voltage follower 3 of this invention functions to drive the gate of the transistor M2, which may be a power transistor, with controlled impedance. The follower 3 has, in fact, its output impedance adjustable, and particularly for one purpose of this invention, may thereby influence the overall M2 capacitance value, such that it is effectively lower than the value to be had without the follower. The latter value is that substantially determined, as previously explained in connection with the prior current mirror circuit of FIG. 1, by the intrinsic capacitances present on the gate terminals of the mirror transistors. Where the mirror ratio is a high one, so that the size of the transistor M1 is negligible compared to the output transistor M2—as previously explained already—the significant gate capacitances are bound to be those of M2, which have been shown in dashed lines for clarity in FIG. 3 as well. By reducing, in accordance with the invention, the effective overall capacitance as seen from the control terminal Ga2 of M2, the voltage follower 3 provided allows the pole due to the capacitances Cs and Cd to be shifted toward higher frequencies.

Advantageously, the circuit 2 of this invention can therefore make the harmful effect of the gate-to-source capacitance of the output transistor M2 negligible. As a result, the circuit response can be made faster, and the shift in the second cutoff frequency to increase the separation of the two poles, makes for a more stable overall system.

Notice that the mirror type of circuit according to the invention could be implemented otherwise by a skilled person in the art. The input and output legs could include additional circuit elements, such as MOS-type transistors, and still be encompassed by this invention. For example, a transistor may be connected in parallel with M1 or M2 to provide a mirror of more elaborate construction. Also, a generator circuit could comprise a replica of a certain number of mirror circuits 2 arranged in cascade.

Further, the voltage follower 3 may be implemented with other impedance matching circuit means, provided that they can perform the same functions as in the follower described hereinabove.

Figure 4:
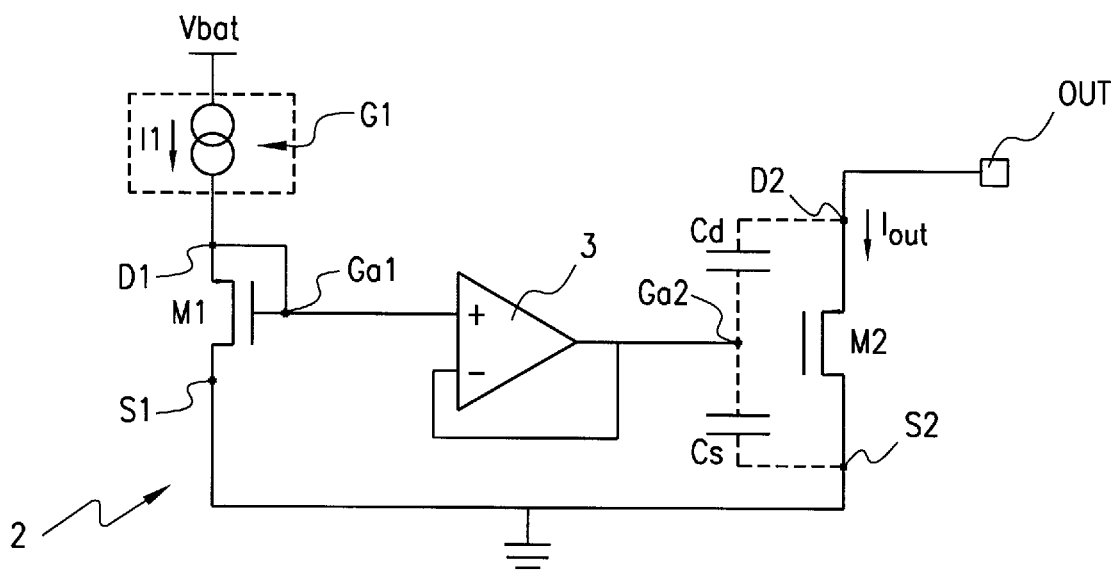
FIG. 4 is an equivalent diagram of the circuit in FIG. 3, wherein the mirror is implemented using transistors of the N-MOS type.

For the sake of completeness, in FIG. 4, there is shown a MOS transistor current mirror type of generator circuit similar to that shown in FIG. 3, except that N-channel transistors are used here.

Unlike the circuit just described, in this implementation, the mirror circuit 2 is powered through a ground terminal to which the source terminals S1 and S2 of the transistors M1 and M2 are connected. In addition, the flow directions of the currents are reversed. Its operation is otherwise the same as that of the circuit in FIG. 3.

Figure 5:
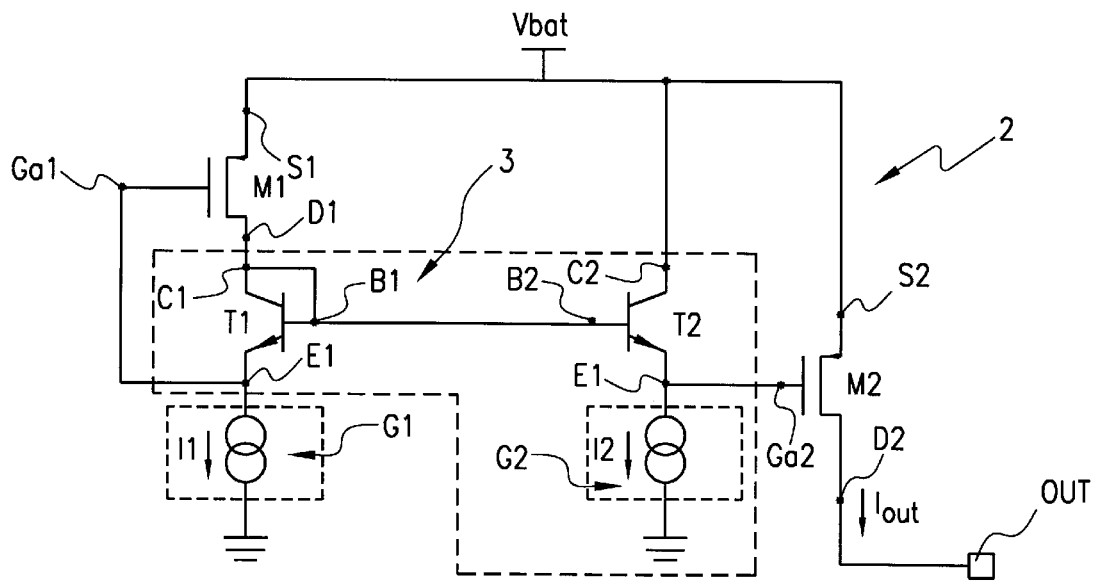
FIG. 5 shows an embodiment of the current mirror circuit according to the invention.

FIG. 5 shows a preferred embodiment of the generator circuit 2, in the instance of P-channel MOS transistors being used. The same references numbers are used in this Figure as in FIG. 3.

As shown in the Figure, the voltage follower 3 comprises a pair of bipolar transistors T1 and T2, and a second current generator G2.

The transistors T1 and T2 are of the NPN type in this embodiment and operate in a mirror configuration, having the same base-emitter voltage, with their respective control or base terminals B1 and B2 connected directly. In the preferred embodiment of the invention, the transistors T1 and T2 are the same size and have the same characteristics.

The transistor T1 is diode-connected, having its base B1 and collector C1 terminals shorted together. This transistor is connected between the drain D1 and gate Ga1 terminals of the transistor M1, through its collector terminal C1 and an emitter terminal E1, respectively.

The transistor T2 has a terminal, specifically an emitter terminal E2, connected to the gate terminal Ga2 of M2. The current I2 is forced through T2 by means of the second generator G2, connected to the aforementioned emitter terminal E2. A collector terminal C2 of the transistor T2 is connected directly to the supply line Vbat.

Notice that, in accordance with this invention, the transistors M1 and M2 are once again operated in a mirror configuration. It is assumed, in fact, that the emitter areas of the transistors T1 and T2 are identical, since a pair of identical transistors have been chosen as mentioned above. Under this condition, M1 and M2 operate at the same gate-source voltage, as shown by the following relationships:

Let $V_{Ga1}$ and $V_{Ga2}$ be the respective voltages at the gate terminals Ga1 and Ga2 of the transistors M1 and M2, then from the Figure it is readily derived that:

$$V_{Ga1}+Vbe(T1)=V_{Ga2}+Vbe(T2) \qquad (1)$$

where Vbe(T1) and Vbe(T2) are the base-emitter voltages of T1 and T2, respectively, and $$V_{Ga1}=Vbat+Vgs(M1) \qquad (2)$$

where, Vgs(M1) is the gate-source voltage of M1. From (1) and (2) it is found, since Vbe(T1)=Vbe(T2), that $$V_{Ga2}=V_{Ga1}+Vbe(T1)-Vbe(T2)=V_{Ga1}=Vbat-Vgs(M1).$$

Therefore, the circuit 3 allows the same voltage to be held at the gate terminals Ga1 and Ga2 of the transistors M1 and M2. This is obtained by inserting in a mirror-image fashion a pair of similar junctions, i.e. the base-emitter junctions of the bipolar transistors T1 and T2, between the control terminals Ga1, Ga2 of the transistors M1, M2 and a common node, specifically a connection node between the base terminals B1 and B2 of T1 and T2.

The operation of the circuit shown in FIG. 5 is generally the same as that of a current mirror made up of the transistors M1 and M2.

Furthermore, as shown in the Figure, the reference current I1 is forced through the transistor MOS M1, as well as through the T1, which is in series with the generator G1 and in its "on" state. The transistor T2 is also in its conducting state and admits a current flow, specifically of the current I2 supplied to it from the second generator G2. Some of the outgoing current I2 from the transistor T2 is supplied to the gate terminal Ga2 of the transistor M2 and used to charge the intrinsic gate-to-source and gate-to-drain capacitances. These gate capacitances, not shown in FIG. 5, of the transistor M2 are therefore charged at a faster rate on account of the current I2 being supplied to them. As a result, the transistor M2 switching speed will be increased.

In accordance with this invention, the provision of a voltage follower 3 is mainly effective to reduce the overall capacitance, as seen from the gate terminal Ga2, of the output transistor M2 of the current mirror 2. From an analysis of the frequency response of the circuit in FIG. 5, the value of the cutoff frequency determined by the pole due to the intrinsic capacitances of M2 can be found. The corresponding frequency f1' of this pole is now expressed by $$f1'=(\tfrac{1}{2}\pi) \times gm_{M1} \times \beta_{T2}/(Cs+Cd)$$

where, $gm_{M1}$ is the transconductance of M1, Cs and Cd are respectively the gate-to-source and gate-to-drain capacitances of the transistor M2, and $\beta_{T2}$ is the proportionality factor or amplification factor, which is constant and greater than one, between the collector current and the base current of the transistor T2. As a comparison with the cutoff frequency f1 for the conventional circuit described hereinbefore brings out, in the circuit of FIG. 5, the term referring to the effective overall capacitance as seen from the gate terminal Ga2 of M2, namely Cs+Cd, is diminished by the factor $\beta_{T2}$. This is because the gate terminal Ga2 of M2 is driven with a current which has been amplified in accord with the amplification factor $\beta_{T2}$ of the transistor T2.

Thus, the pole due to the intrinsic capacitances on the gate of M2 will be shifted toward higher frequencies than in the prior art previously discussed. Advantageously, in the circuit of FIG. 5, this intrinsic capacitance pole is, therefore, pulled away from the leading pole due, for example, to the presence of a load on the output terminal OUT, as previously explained. The stability problems of the whole circuit are thus made substantially negligible. At the same time, the reduction in the effective capacitance, and hence in the impedance on the gate terminal of the larger transistor, makes for a faster frequency response of the circuit 2.

Basically the preferred embodiment of this invention provides, in the voltage follower 3 and for the set purposes, an output stage which includes a low-impedance amplifying element, namely the transistor T2, operatively connected to the control terminal Ga2 of the output transistor M2 of the current mirror.

Furthermore, the generator circuit of the current mirror type according to the invention is particularly simple from the standpoints of its construction and manufacturing process, while exhibiting excellent performance in terms of frequency response.

Notice that, by lowering the gate capacitance of the output transistor M2, the circuit of this invention advantageously allows a high mirror ratio X to be used without a deleterious effect. For the same output current $I_{out}$—whose value is usually predetermined by specific application requirements and is given, as will be recalled, by the product of the input current I1 and the mirror ratio X—this allows a smaller input or reference current I1 to be used. Thus, the so-called no-load current consumption, i.e. the current used to operate the circuit but substantially unused for the purpose of driving the load, can also be reduced.

A further advantage of the circuit shown in FIG. 5 is the rejection to any disturbance appearing on the supply line Vbat.

Figure 1:
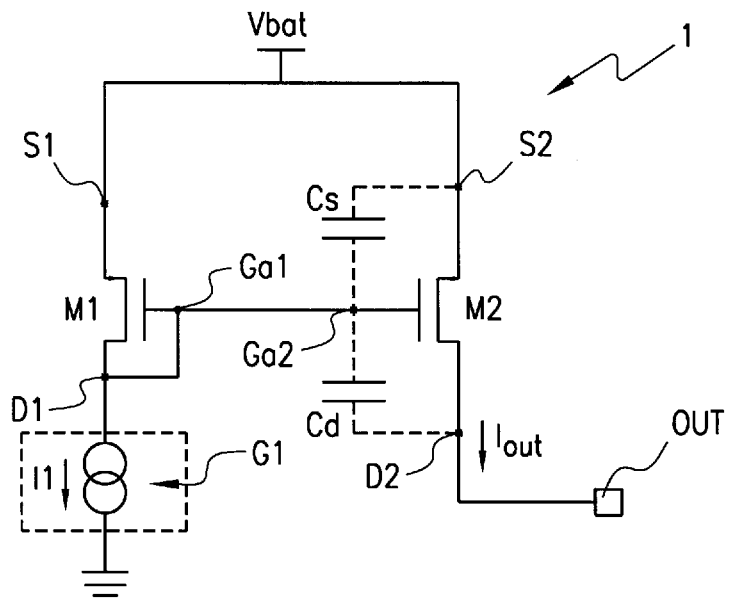
FIGS. 1 and 2 are diagrams of conventional generator circuits of the current mirror type including P-MOS and N-MOS transistors, respectively, as previously discussed.

In fact, should a voltage spike occur at the supply in the conventional circuit of FIG. 1, the gate terminal of M2 would impose a certain inertia due to the capacitances Cs and Cd and fail to follow the voltage variation that has occurred at its source. This causes a variation in the gate-source voltage which is slow to settle on account of the high impedance present at the gate. Consequently, the output current would suffer a corresponding variation which is undesirable.

By contrast, in the circuit of this invention shown in FIG. 5, assuming that the supply spike is a positive one, the gate Ga1 of the transistor M1 would follow that variation, and the common terminal B1–B2 voltage would begin to rise rapidly. The gate Ga2 of M2, and therefore the emitter E2 of T2, will not follow the gate Ga1 of M1 with the same time constant because the intrinsic capacitances of the two gates are different. This results in the base-emitter voltage of T2, and hence its current, being increased. However, since the current I2 from the generator G2, which is forced through T2, is constant, the capacitance on the gate Ga2 of M2 will be supplied a larger amount of current and, therefore, charged at a faster rate. In this way, a feedback effect is obtained from the transistor T2 provided.

If the spike is negative, the effect will be symmetrical because the base B2 of T2 tends to remain at the same voltage, resulting in a decrease of the base-emitter voltage of the transistor and, hence, its current. Since I2 is constant, the current differential is drawn by the intrinsic capacitance Cs connected with the gate Ga2 of M2, which will be discharged rapidly.

Some advantages come from the provision, in the preferred embodiment of the follower according to the invention shown in FIG. 5, of using a bipolar, rather than MOS, pair of transistors. Basically, bipolar transistors have a lower triggering voltage than MOS transistors. For the purposes of this invention, it is important to observe, moreover, that bipolar transistors introduce no further poles in the transfer function of the system.

It should also be noted that the circuit arrangement of FIG. 5 has no limitations from the dynamic range standpoint. The gates of the transistors M1 and M2 can, in fact, be grounded, thereby utilizing the highest possible voltage Vbat as gate-source voltage for their turn-on while ensuring proper operation of the circuit in any case. In particular, the transistors T1 and T2 develop no defects in their operation.

It should be considered that, in the embodiment of FIG. 5, two generic current generators G1 and G2 have been shown which may be implemented in any desired manner, e.g. by resistors. The current I1 from G1 constitutes the current that is to be mirrored, and accordingly it will be determined, for a specific embodiment of the circuit or specified mirror ratio, by the output current $I_{out}$. In its simplest form, the generator G2 can be independent of G1 and supply a predetermined current I2. The current I2 may optionally be arranged, however, to be dependent on the current I1, and in particular, proportional to the latter.

Figure 6:
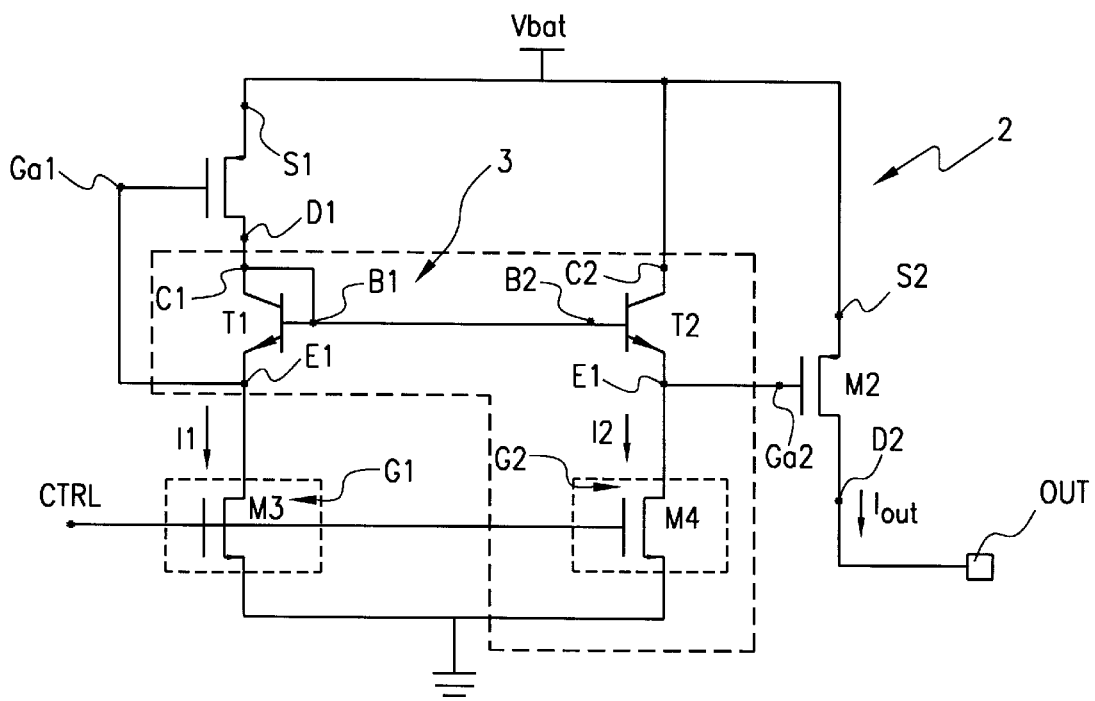
FIG. 6 shows a further embodiment of this invention in greater detail.

A circuit embodiment including a pair of current generators which are operatively dependent is shown in FIG. 6.

As shown in that Figure, the generators G1 and G2 consist of MOS transistors, specifically of the P-channel type, M3 and M4, respectively, which are connected together into a current mirror. Therefore, the respective currents supplied by G1 and G2 will be mutually dependent, with I2 being proportional to I1. More particularly, the transistors have their drain terminals operatively connected to the transistors M1 and M2, and source terminals connected to ground.

The control terminals, i.e. the gate terminals of M3 and M4, connected directly to each other, in the preferred embodiment shown in FIG. 6, are further connected to a control node, denoted by CTRL. The control voltage is supplied by the feedback loop controlling the mirror circuit itself. This allows a dynamic driving of the gate of M2 to be provided, whereby the turn-on speed of M2 is increased. These are additional advantages to those previously described in relation to the circuit of FIG. 5.

Thus, the generator circuit of the mirror current type according to this invention provides a method of generating, at a controlled rate, from a reference current (I1) a mirrored current ($I_{out}$) on an output terminal (OUT), which method comprises the steps of, providing an input circuit leg and an output circuit leg, coupled to each other by respective control nodes (Ga1 and Ga2);

forcing the reference current (I1) through the input circuit leg;

stabilizing the potential at the control node (Ga2) of the output circuit leg by means of a voltage follower circuit (3) with adjustable output impedance, thereby to vary the impedance as seen from said control node (Ga2); and generating the mirrored current ($I_{out}$) through said output leg.

Preferably, as previously explained, the above-mentioned output impedance has a lower value than that to be obtained with the control nodes (Ga1 and Ga2) shorted together.

Consistently with the description given in connection with FIG. 6, this method comprises a further step of stabilization of the mirror current value by a means effective to vary the reference current according to the mirrored output current.

Figure 7:
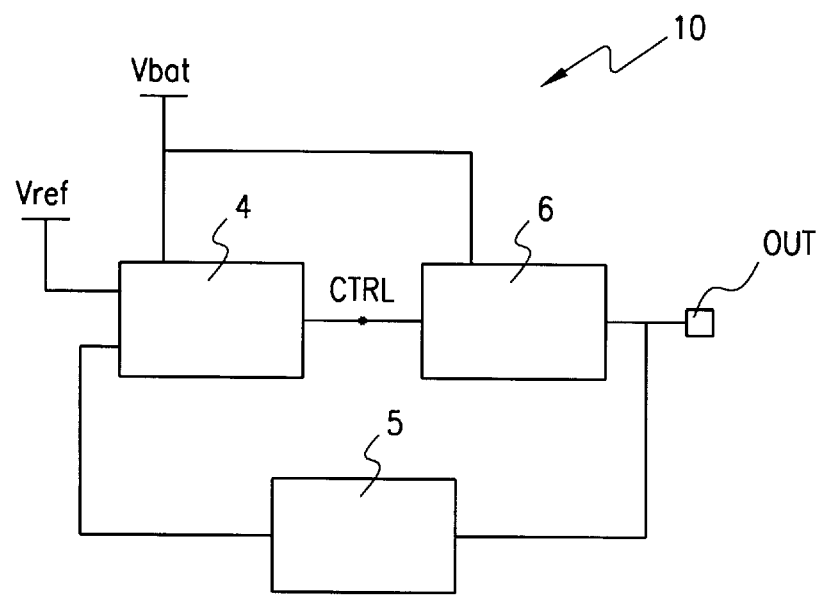
FIG. 7 is a diagram of a voltage regulator incorporating a current mirror circuit according to the invention.

FIG. 7 shows a block diagram of a voltage regulator circuit, the output stage of which is provided by a current mirror circuit according to the invention. In particular, the output stage comprises a power output transistor of the P-MOS type and, placed upstream of this, a further transistor which is connected into a mirror configuration therewith, e.g. as shown in FIG. 6.

The regulator 10 comprises a driving stage, generally shown at 4, a feedback block 5, and the output stage 6.

The driving stage 4 has a first input connected to a terminal which is held at a reference voltage Vref, and an output which is connected to a control terminal CTRL. The output stage 6 is driven by the driving stage 4 through the control terminal CTRL and is connected by its output to the output terminal OUT. The output of the stage 6 is also feedback-connected to a second input of the driving stage 4 via the feedback block 5. In addition, the driving stage 4 and output stage 6 are powered from a supply line Vbat.

As shown in FIG. 6, wherein the gate terminal of the reference current generator M3 is connected to a control node CTRL, the reference current of the mirror circuit, i.e. the current which flows through the output stage 6 of FIG. 7, is not a constant one, but is controlled by the driving stage 4. In particular, it is dependent on the outgoing current from the stage 4 being driven by the feedback block 5.

The voltage regulator having at its output a current mirror which includes an impedance matching means, in accordance with this invention, is particularly stable, even at high frequencies of operation.

Figure 8:
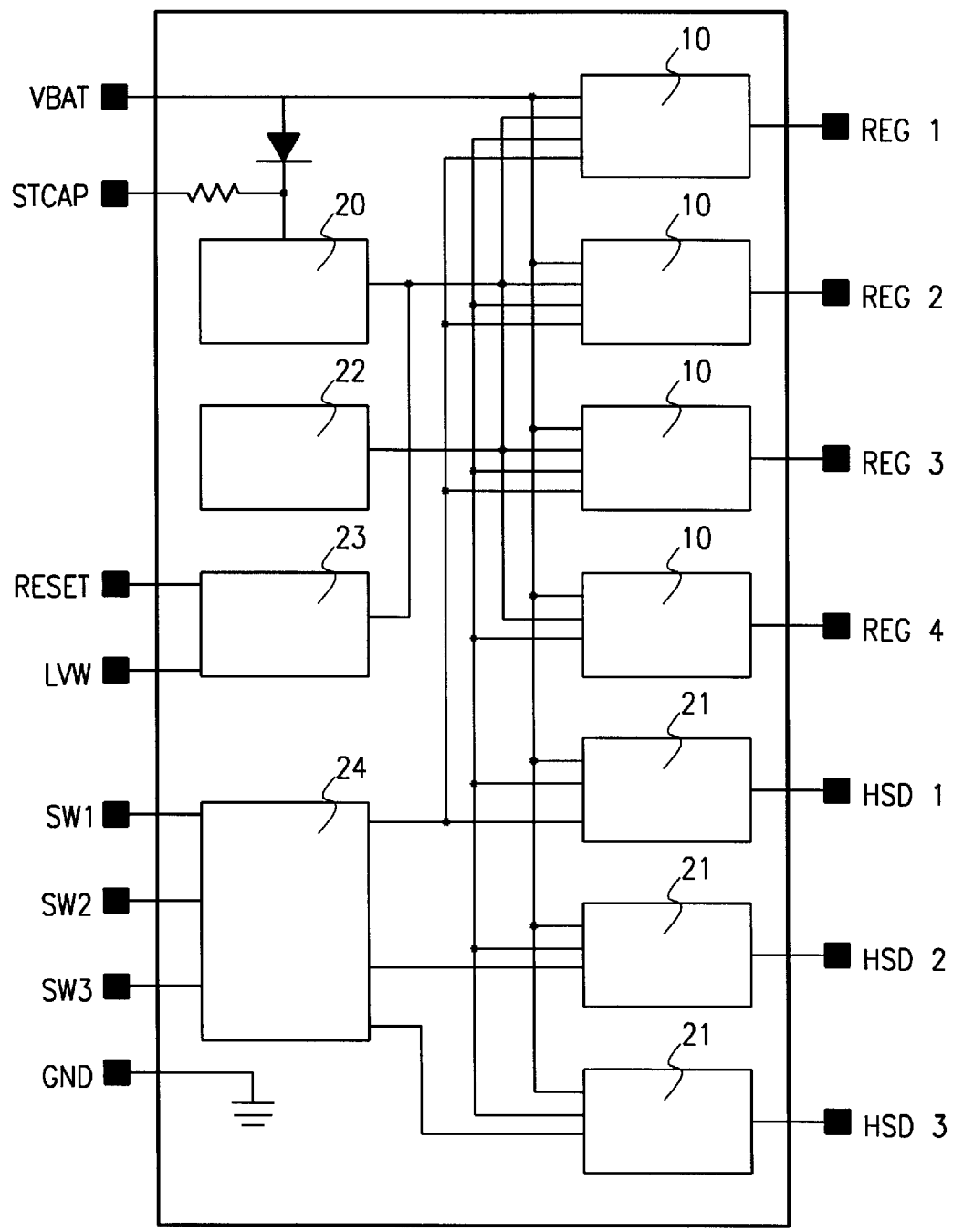
FIG. 8 is a block diagram illustrating an application of the voltage regulator of FIG. 7 to a driver system for automotive audio devices.

A device which incorporates a voltage regulator 10 of the type shown in FIG. 7, is schematically illustrated by FIG. 8. The device 10 is used in automotive applications to drive portions of the wireless system, e.g. the power supply of a radio, the power supply of a control microprocessor for the system, the aerial switch, and the switch of the recorder driver. The device is preferably integrated into a common integrated circuit.

Referring to FIG. 8, the block 20 is a reference voltage generator, specifically of the band-gap type. The reference voltage is temperature stable, and its value determines that of the voltages supplied to the regulator outputs. The regulators are of the kind shown in FIG. 7, and are all denoted by the numeral 10. They supply on their outputs regulated voltages REG1, REG2, REG3 and REG4 which normally have different values from one another. Typical values for such voltages are 10V, 8.5V and 5V. The blocks 21 are high-side drivers, i.e. driving devices which supply a current, I1, I2 and I3, to the electric load connected to respective outputs HSD1, HSD2 and HSD3. In a preferred embodiment, these currents may be as follows: I1=2A, I2=I3=200 mA. The regulating blocks 10, driving blocks 21 and the reference potential generator circuit 20 are all powered from the voltage supply Vbat.

The block 22 is a current limiting circuit which includes protection from shorts for the regulators 10 and the driving circuits 21.

A specific control circuit for the microprocessor, not shown in detail, is contained in the block 23. The terminals RESET and LVW (Low Voltage Warning) represent connections to the microprocessor. The block 23 is connected to an output of the circuit 20 that generates the reference voltage.

The block 24 contains further protective devices, such as a thermal protection against excessive rise of temperature in the device, a dump protection from overvoltages in Vbat, and a protection from possible electrostatic discharges. This block is also connected by its output to each of the voltage regulators 10 and the driving circuits 21.

Terminals SW1, SW2 and SW3 for connection to the microprocessor serve to turn the regulators and drivers on and off, namely SW1 the first three regulators 10 and the first driver 21, SW2 the second driver 21, and SW3 the third driver 21. The fourth regulator 10 instead is always on.

Figure 9:
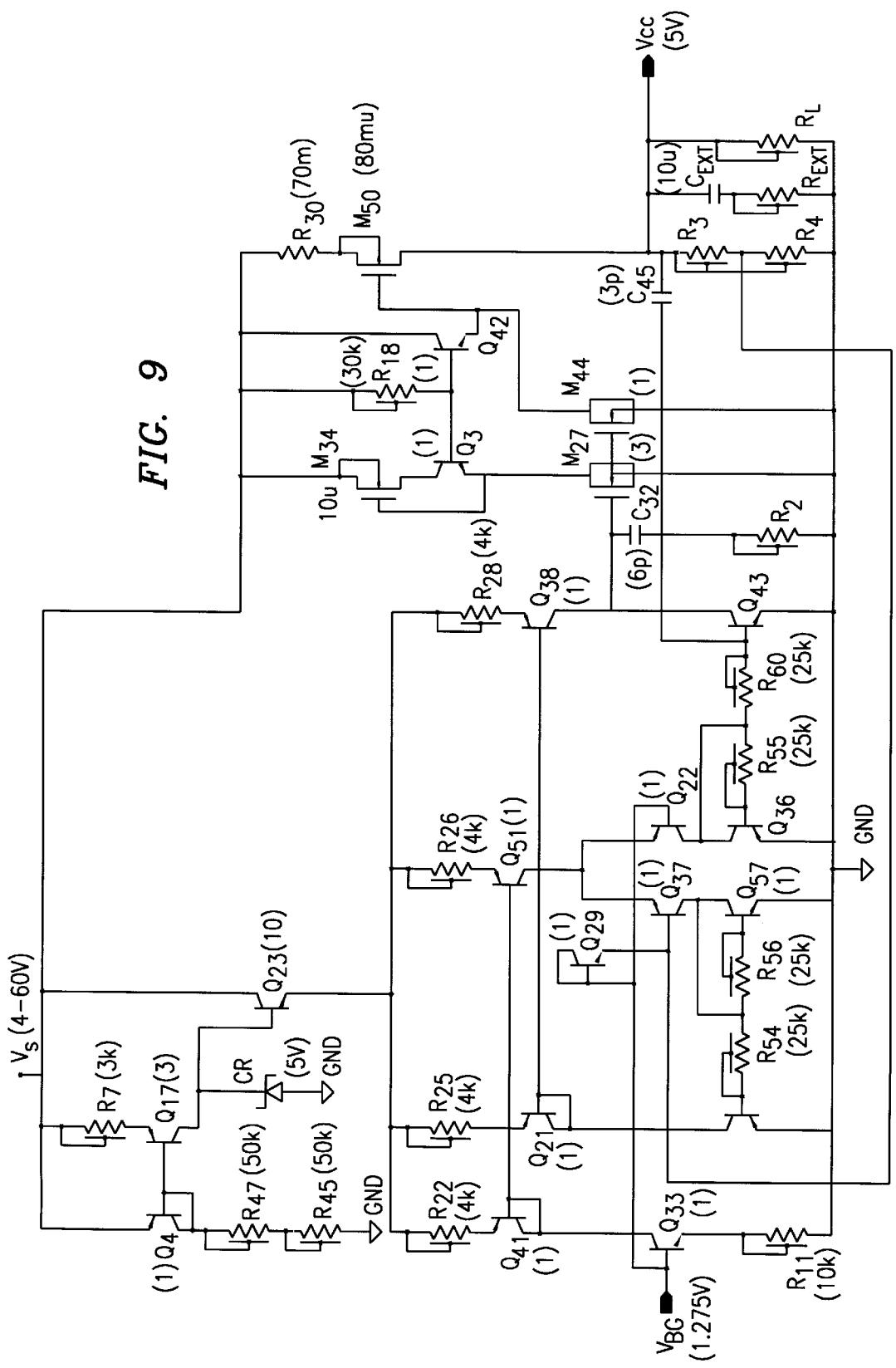
FIG. 9 shows an embodiment of the innovative circuit as used in an automotive antilock braking system.

FIG. 9 shows one embodiment of the present invention as used in a circuit employed in an automotive antilock braking system. FIG. 9 also illustrates specific electronic component values.

It should be understood that changes and modifications may be made to the current generator with a wide frequency response described in the foregoing, without departing from the scope of this invention as defined in the following claims.

According to one disclosed class of innovative embodiments, there is provided a current generator circuit with controllable frequency response, comprising at least one current mirror formed of MOS transistors, being powered through a terminal held at a constant voltage, having an input leg which includes at least a first diode-connected transistor through which a reference current is forced by a first current generator coupled to a first terminal of said first transistor, and having an output leg which includes at least a second transistor to generate, onto an output terminal of the mirror coupled to a first terminal of the second transistor, a mirrored current which is proportional to said reference current, a control terminal of the first transistor being coupled to a corresponding control terminal of the second transistor, and said first and second transistors having respective second terminals connected to the terminal held at the constant voltage, and further comprising an impedance matching means connected between said control terminals of the first and second transistors and configured to hold the same voltage value at both terminals.

According to another disclosed class of innovative embodiments, there is provided a voltage regulating circuit of the type which comprises: an output stage having an output terminal and a control terminal, and being powered through a terminal which is held at a constant voltage; and a driving stage being powered through said terminal held at a constant voltage, connected with its output to said control terminal, and having a first input held at a reference voltage and a second input to which said output terminal of the output stage is feedback-connected via a feedback block; characterized in that said output stage comprises a current generator circuit with controllable frequency response, comprising at least one current mirror formed of MOS transistors, being powered through a terminal held at a constant voltage, having an input leg which includes at least a first diode-connected transistor through which a reference current is forced by a first current generator coupled to a first terminal of said first transistor, and having an output leg which includes at least a second transistor to generate, onto an output terminal of the mirror coupled to a first terminal of the second transistor, a mirrored current which is proportional to said reference current, a control terminal of the first transistor being coupled to a corresponding control terminal of the second transistor, and said first and second transistors having respective second terminals connected to the terminal held at the constant voltage, and further comprising an impedance matching means connected between said control terminals of the first and second transistors and configured to hold the same voltage value at both terminals.

According to another disclosed class of innovative embodiments, there is provided: a current mirror circuit, comprising: a first field effect transistor, connected to be driven by an input current at a drain terminal thereof; a second field effect transistor, connected to provide an output current at a drain current thereof; said first and second field effect transistors having source terminals thereof connected in common; and a voltage-follower amplifier, comprising bipolar transistors, connected to drive a gate terminal of said second field effect transistor to a voltage which is equal to the voltage of a gate terminal of said first field effect transistor.

According to another disclosed class of innovative embodiments, there is provided a current mirror circuit comprising: first and second field-effect transistors having respective source terminals connected to a first power supply connection; said first field-effect transistor being connected to be driven by an input current at a drain terminal thereof; said second transistor having more than three times the width of said first transistor; and first and second bipolar transistors biased to operate at equal emitter current densities and having base terminals thereof connected together; wherein said first and second bipolar transistors are connected together to drive the gate of said second field effect transistor in a voltage follower relationship, so that the voltage of the gate of said second field effect transistor is equal to the voltage of the gate of said first field effect transistor.

According to another disclosed class of innovative embodiments, there is provided a current mirror circuit comprising: first and second field-effect transistors having respective source terminals connected to a first power supply connection; said second transistor having more than three times the width of said first transistor; third and fourth fieldeffect transistors, said third transistor being connected to be biased by a control signal and accordingly to drive an input current through a drain terminal of said first field effect transistor; said third and fourth transistors being of opposite conductivity type to said first and second transistors, and having respective source terminals thereof connected together to a power supply terminal of a polarity opposite to said source terminals of said first and second transistors; first and second bipolar transistors, said first bipolar transistor having emitter and collector terminals thereof interposed between said first and third field effect transistors, and said second bipolar transistor having a base terminal connected in common with said first bipolar transistor and being connected between said fourth field effect transistor and said first power supply connection; wherein the emitter area of said first bipolar transistor, divided by the width of said third field effect transistor, is equal to the emitter area of said second bipolar transistor, divided by the width of said fourth field effect transistor; wherein said first and second bipolar transistors are connected together to drive the gate of said second field effect transistor in a voltage follower relationship, so that the voltage of the gate of said second field effect transistor is equal to the voltage of the gate of said first field effect transistor; whereby said second field effect transistor provides an output current which is a precise multiple of the current passed by said third field effect transistor.

According to another disclosed class of innovative embodiments, there is provided a voltage regulating circuit comprising: an output stage having an output terminal and a control terminal, and being powered through a terminal which is held at a constant voltage; and a driving stage being powered through said terminal held at a constant voltage, connected with its output to said control terminal, and having a first input held at a reference voltage and a second input to which said output terminal of the output stage is feedback-connected via a feedback block; wherein said output stage comprises a current mirror circuit comprising first and second field-effect transistors having respective source terminals connected to a first power supply connection; said first field-effect transistor being connected to be driven by an input current at a drain terminal thereof; said second transistor having more than three times the width of said first transistor; and first and second bipolar transistors biased to operate at equal emitter current densities and having base terminals thereof connected together; wherein said first and second bipolar transistors are connected together to drive the gate of said second field effect transistor in a voltage follower relationship, so that the voltage of the gate of said second field effect transistor is equal to the voltage of the gate of said first field effect transistor.

According to another disclosed class of innovative embodiments, there is provided a device for driving an audio system, comprising: a plurality of voltage regulating circuits generating constant voltages at respective outputs and being powered through a terminal which is held at a constant supply voltage; a plurality of driving circuits supplying currents of predetermined values to respective outputs; a circuit for generating a stable reference voltage to be supplied to each of the voltage regulating circuits and the driving circuits; and a shorting current limiter circuit and a protection block acting on each of the voltage regulating circuits and the driving circuits; said regulating and driving circuits being controlled on and off by external signals through a predetermined number of control terminals of the device; wherein each of said voltage regulating circuits comprise: an output stage having an output terminal and a control terminal, and being powered through a terminal which is held at a constant voltage; and a driving stage being powered through said terminal held at a constant voltage, connected with its output to said control terminal, and having a first input held at a reference voltage and a second input to which said output terminal of the output stage is feedback-connected via a feedback block; wherein said output stage comprises a current mirror circuit comprising first and second field-effect transistors having respective source terminals connected to a first power supply connection; said first field-effect transistor being connected to be driven by an input current at a drain terminal thereof; said second transistor having more than three times the width of said first transistor; and first and second bipolar transistors biased to operate at equal emitter current densities and having base terminals thereof connected together; wherein said first and second bipolar transistors are connected together to drive the gate of said second field effect transistor in a voltage follower relationship, so that the voltage of the gate of said second field effect transistor is equal to the voltage of the gate of said first field effect transistor.

According to another disclosed class of innovative embodiments, there is provided a current generator circuit with controllable frequency response, comprising: at least one current mirror formed of MOS transistors, being powered through a terminal held at a constant voltage, having an input leg which includes at least a first diode-connected transistor through which a reference current is forced by a first current generator coupled to a first terminal of said first transistor, and having an output leg which includes at least a second transistor to generate, onto an output terminal of the mirror coupled to a first terminal of the second transistor, a mirrored current which is proportional to said reference current, a control terminal of the first transistor being coupled to a corresponding control terminal of the second transistor, and said first and second transistors having respective second terminals connected to the terminal held at the constant voltage, and further comprising an impedance matching means connected between said control terminals of the first and second transistors and configured to hold the same voltage value at both terminals.

According to another disclosed class of innovative embodiments, there is provided a method of generating, at a controlled rate, from a reference current a mirrored current on an output terminal, comprising the steps of: providing an input circuit leg and an output circuit leg, coupled to each other by respective control nodes; forcing the reference current through the input circuit leg; stabilizing the potential at the control node of the output circuit leg by means of a voltage follower circuit with adjustable output impedance, thereby to vary the impedance as seen from said control node; and generating the mirrored current through said output leg.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Bipolar transistors T1 and T2, as shown in FIG. 6, preferably occupy the same amount of area. However, in another embodiment, T1 and T2 are not of equal size, but have substantially equal emitter current densities.

For example, as will be obvious to those of ordinary skill in the art, other circuit elements can be added to, or substituted into, the specific circuit topologies shown.

For another example, within the constraints well-known to those of ordinary skill, the innovative concepts can be adapted into a variety of well-known current mirror configurations.

For another example, within the constraints well-known to those of ordinary skill, the disclosed voltage follower configuration can be modified if desired, to the extent possible while preserving the functionality described above.

What is claimed is:

1. A current mirror circuit comprising:
   first and second field-effect transistors having respective source terminals connected to a first power supply connection; said second field effect transistor having more than three times the width of said first transistor;

third and fourth field-effect transistors, said third field effect transistor being connected to be biased by a control signal and accordingly to drive an input current through a drain terminal of said first field effect transistor; said third and fourth field effect transistors being of opposite conductivity type to said first and second field effect transistors, and having respective source terminals thereof connected together to a power supply terminal of a polarity opposite to said source terminals of said first and second field effect transistors;

first and second bipolar transistors, said first bipolar transistor having emitter and collector terminals thereof interposed between said first and third field effect transistors, and said second bipolar transistor having a base terminal connected in common with a base terminal of said first bipolar transistor and being connected between said fourth field effect transistor and said first power supply connection; wherein the emitter area of said first bipolar transistor, divided by the width of said third field effect transistor, is equal to the emitter area of said second bipolar transistor, divided by the width of said fourth field effect transistor;

wherein said first and second bipolar transistors are connected together to drive the gate of said second field effect transistor in a voltage follower relationship, so that the voltage of the gate of said second field effect transistor is equal to the voltage of the gate of said first field effect transistor;

whereby said second field effect transistor provides an output current input which is a precise multiple of the current passed by said third field effect transistor.

2. The integrated circuit of claim 1, wherein said first and second bipolar transistors have equal areas.

3. The integrated circuit of claim 1, wherein said second field-effect transistor has more than ten times the width of said first field-effect transistor.

* * * * *